(12) United States Patent
Drost et al.

(10) Patent No.: US 8,098,079 B2
(45) Date of Patent: Jan. 17, 2012

(54) RECEIVE CIRCUIT FOR CONNECTORS WITH VARIABLE COMPLEX IMPEDANCE

(75) Inventors: Robert J. Drost, Los Altos, CA (US); Robert D. Hopkins, Hayward, CA (US); Alex Chow, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 115 days.

(21) Appl. No.: 12/425,871

(22) Filed: Apr. 17, 2009

(65) Prior Publication Data
US 2010/0264954 A1 Oct. 21, 2010

(51) Int. Cl.
*H03K 17/16* (2006.01)

(52) U.S. Cl. ............... 326/21; 326/26; 326/30; 326/41; 326/47

(58) Field of Classification Search .................. 326/26, 326/27, 30, 34, 81–83, 86, 87; 310/300, 310/309, 317, 334, 318; 257/508, 509, 510, 257/619, 622; 438/149, 151, 270, 271, 294
See application file for complete search history.

(56) References Cited

U.S. PATENT DOCUMENTS

| | | | |
|---|---|---|---|
| 7,670,290 B2 * | 3/2010 | Hossack et al. ............... 600/437 |
| 2006/0290377 A1 * | 12/2006 | Kim et al. ....................... 326/30 |
| 2007/0029646 A1 | 2/2007 | Voldman | |

FOREIGN PATENT DOCUMENTS

EP  1650801 A2  4/2006

* cited by examiner

*Primary Examiner* — Shawki S Ismail
*Assistant Examiner* — Christopher Lo
(74) *Attorney, Agent, or Firm* — Park, Vaughan, Fleming & Dowler LLP; Steven E. Stupp

(57) ABSTRACT

Embodiments of a circuit for use with an inter-chip connection that has a variable complex impedance (which can be conductive, capacitive or both), a system that includes the circuit, and a communication technique are described. This inter-chip connection may be formed between a microspring or an anisotropic film and a metal connector on or proximate to a surface of a chip. Moreover, the circuit may mitigate signal distortion associated with the variable complex impedance. For example, the circuit may include an internal impedance that is electrically coupled in series with the metal connector, and that has an impedance which dominates the variable complex impedance over a range of operating frequencies. Separately or additionally, the circuit may be adapted to correct for the signal distortion.

19 Claims, 10 Drawing Sheets

PROCESS
1300

RECEIVE AN ELECTRICAL SIGNAL FROM A RECEIVE CONNECTOR THAT IS ELECTRICALLY COUPLED TO ONE OR MORE INTER-COMPONENT CONNECTORS, WHERE THERE IS A RECEIVE VARIABLE COMPLEX IMPEDANCE BETWEEN THE RECEIVE CONNECTOR AND THE ONE OR MORE INTER-COMPONENT CONNECTORS, AND THIS RECEIVE VARIABLE COMPLEX IMPEDANCE CORRESPONDS TO A FIRST RESISTOR IN PARALLEL WITH A FIRST CAPACITOR
1310

CHARACTERIZE THE RECEIVE VARIABLE COMPLEX IMPEDANCE BASED AT LEAST IN PART ON THE RECEIVED ELECTRICAL SIGNAL
1312

CONFIGURE A RECEIVE CIRCUIT TO MITIGATE SIGNAL DISTORTION ASSOCIATED WITH THE RECEIVE COMPLEX VARIABLE IMPEDANCE BASED AT LEAST IN PART ON THE CHARACTERIZATION OF THE RECEIVE VARIABLE COMPLEX IMPEDANCE
1314

FIG. 13

RECEIVE CIRCUIT FOR CONNECTORS WITH VARIABLE COMPLEX IMPEDANCE

BACKGROUND

1. Field of the Invention

The present invention relates to circuits that mitigate signal distortion caused by a variable complex impedance between a connector on a semiconductor die and one or more microspring or anisotropic-film inter-component connectors.

2. Related Art

As integrated-circuit (IC) technology continues to scale to smaller critical dimensions, it is increasingly difficult for existing inter-chip connections to provide suitable communication characteristics, such as: high bandwidth, low power, reliability and low cost. Several technologies have been proposed to address this problem. These proposed technologies include: proximity communication or PxC (for example, with capacitive inter-chip contacts), inter-chip microsprings (with conductive inter-chip contacts), anisotropic films (for example, where the anisotropic film includes an elastomer), and a combination of PxC with microsprings (with capacitive inter-chip contacts). However, the proposed techniques often introduce additional packaging and reliability challenges.

PxC based on capacitive inter-chip contacts provides dense inter-chip connections, with a pitch between neighboring pads on the order of 10-100 µm. However, PxC typically requires a similar order of mechanical alignment. It can be difficult to maintain this alignment in the presence of vibrations and thermal stress using a low-cost chip package. Furthermore, the capacitance of the inter-chip contacts can be small, which makes it challenging to couple high-capacity power supplies using PxC.

Microsprings can be fabricated on a wide variety of surfaces, including: printed circuit boards (PCBs), organic or ceramic IC packages or on the surface of ICs themselves. They can be fabricated with an areal density of inter-chip connections that exceeds the density of input/output (I/O) signals on high performance ICs, and can provide electrical contacts without the use of solder. Moreover, microsprings can be designed to have more compliance than is possible by using PxC alone, which increases the tolerance to mechanical movement and misalignment. However, microsprings are typically required to make and maintain conductive contacts with connectors on ICs. In order to achieve such conductive contacts, the microsprings typically have sharp tips that can scrape through any oxide or passivation layers above the connectors on the ICs during a scrub-in process, which increases the fabrication costs of the microsprings. Furthermore, conductive contacts are often achieved by increasing the force between the microsprings and the connectors on an IC in a chip package, which also increases cost. In addition, the sharp tips and large forces can produce foreign particles (such as debris) that can reduce the conductivity of contacts over time, thereby reducing reliability and limiting the number of mating cycles.

Anisotropic conductive films can be fabricated by introducing conductive elements into an insulating elastic film so that the conductive elements generally line up normal to the surface of the film. Then, by placing the anisotropic film against a chip pad and compressing it, the conductive elements can make conductive contact, while the non-conductive film maintains isolation among neighboring chip pads. Unlike the microsprings, conduction through the anisotropic film typically involves conduction between the chip pad and its proximal conductive elements in the anisotropic film, and among the various conductive elements that are adjacent to each other within the anisotropic film. Similar to microsprings, anisotropic films often suffer from reliability issues due to the potential for the conductive elements to fail to make adequate contact with each other and with the chip pad. While reliability can be increased by increasing the compressive force, the chip package typically has to provide and maintain this higher force. In general, higher forces within a chip package decrease the chip-package reliability in other ways and increase the packaging cost.

In order to overcome such scrub-in and reliability problems, inter-chip connections that combine PxC and microsprings or anisotropic films have been proposed. However, this approach introduces additional challenges. For example, the capacitive (or inductive) signaling techniques used in PxC typically do not tolerate conductive inter-chip contacts. As a consequence, the oxide layer above the connectors on the ICs needs to be thick and hard enough to prevent cracking, which can cause conductive contacts. This thicker oxide layer reduces the energy that is capacitively coupled between chips, which makes receiving electrical signals more difficult. In addition, it limits the amount of power that can be supplied to an IC via capacitively coupled microsprings or anisotropic films.

Hence, what is needed is a technique for achieving inter-chip connections without the problems described above.

SUMMARY

One embodiment of the present invention provides a semiconductor die that includes a receive connector that is proximate to or on a surface of the semiconductor die. This receive connector mechanically and electrically couples to one or more first inter-component connectors, thereby defining a receive variable complex impedance between the receive connector and the one or more first inter-component connectors. Note that the receive variable complex impedance corresponds to a first resistor in parallel with a first capacitor. Moreover, the semiconductor die includes a receive circuit, which is electrically coupled to the receive connector, that receives an electrical signal. This receive circuit mitigates signal distortion associated with the receive variable complex impedance.

In some embodiments, the receive circuit can be adaptively configured to mitigate the signal distortion of the received electrical signal. Consequently, a configuration of the receive circuit may be selected, directly or indirectly, based at least in part on the receive variable complex impedance. For example, the receive circuit may be configured by adjusting a time constant of an RC circuit in the receive circuit to approximately equal a product of a resistance of the first resistor and a capacitance of the first capacitor. Moreover, the semiconductor die may include a control-logic circuit that characterizes the receive variable complex impedance and that selects the configuration of the receive circuit.

Note that, depending on the electrical contacts between the receive connector and the one or more first inter-component connectors, a resistance of the first resistor may be between 0.001-100 GΩ.

To address this variability, the semiconductor die may include an internal impedance electrically coupled in series between the receive connector and the receive circuit, where an impedance of the internal impedance dominates the receive variable complex impedance over a range of frequencies associated with the received electrical signal. Note that the internal impedance may include an inductor and/or a second capacitor. For example, a capacitance of the second capacitor may be significantly smaller than a capacitance of the first capacitor. Furthermore, the capacitance of the second capacitor may be defined by a dielectric layer in the semiconductor die.

In some embodiments, the received electrical signal includes a signal modulated on a carrier having a fundamental frequency greater than zero. Moreover, the received electrical signal may include data and/or power signals. For a power signal, the receive circuit may include a rectifier circuit to recover a DC-power signal from the received electrical signal.

Note that the semiconductor die may include one or more electrostatic-discharge-protection connectors proximate and adjacent to the receive connector. Additionally, the semiconductor die may include an electrostatic-discharge-protection component electrically coupled to the receive connector in parallel with the receive circuit and/or a fringe-field shield proximate and adjacent to the second capacitor.

In some embodiments, the semiconductor die includes a transmit connector proximate to or on the surface of the semiconductor die. This transmit connector mechanically and electrically couples to one or more second inter-component connectors, thereby defining a transmit variable complex impedance between the transmit connector and the one or more second inter-component connectors. Note that the transmit variable complex impedance corresponds to a second resistor in parallel with a second capacitor. Moreover, the semiconductor die may include a transmit circuit, which is electrically coupled to the transmit connector, that transmits another electrical signal.

In some embodiments, the one or more first inter-component connectors include a microspring or an anisotropic film.

Another embodiment provides a system that includes the semiconductor die, another semiconductor die, and an inter-connect component that mechanically and electrically couples the semiconductor die and the other semiconductor die. This inter-connect component includes the one or more first and/or the one or more second inter-component connectors.

Another embodiment provides a method for communicating an electrical signal, which may be performed by the semiconductor die (or one or more circuits on the semiconductor die). During operation, the semiconductor die receives the electrical signal from the receive connector that is mechanically and electrically coupled to one or more inter-component connectors. Note that there is a receive variable complex impedance between the receive connector and the one or more inter-component connectors, and this receive variable complex impedance corresponds to the first resistor in parallel with the first capacitor. Then, the semiconductor die characterizes the receive variable complex impedance based at least in part on the received electrical signal. Next, the semiconductor die configures the receive circuit to mitigate signal distortion associated with the receive variable complex impedance based at least in part on the characterization of the receive variable complex impedance.

BRIEF DESCRIPTION OF THE FIGURES

FIG. 13 is a flow chart illustrating a process for communicating an electrical signal in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a circuit for use with an inter-chip connection that has a variable complex impedance (which can be conductive, capacitive or both), a system that includes the circuit, and a communication technique are described. This inter-chip connection may be formed between a microspring or an anisotropic film and a metal connector on or proximate to a surface of a chip. Moreover, the circuit may mitigate signal distortion associated with the variable complex impedance. For example, the circuit may include an internal impedance that is electrically coupled in series with the metal connector, and that has an impedance which dominates the variable complex impedance over a range of operating frequencies. Separately or additionally, the circuit may be adapted to correct for the signal distortion.

By tolerating the variable complex impedance of the inter-chip connection (and in particular, complex impedances that can be conductive and/or capacitive), this communication technique may reduce or eliminate the need for and the sensitivity to an oxide or passivation layer over the metal connector, which may increase the signal energy transferred through the inter-chip connection between the microspring or anisotropic-film contact and the metal connector. In addition, the communication technique may allow: reduced microspring tip sharpness or anisotropic-film conductivity; reduced contact force; eliminate a scrub-in process; increased reliability of the inter-chip connection and the system; reduced sensitivity to misalignment between the microspring or anisotropic-film contact and the metal connector; smaller electrostatic discharge (ESD) protection components (which take up valuable chip area; reduce the maximum operating frequency and consume power); and/or reduced fabrication and assembly costs for the microspring or anisotropic film and package for the system.

Figure 1A:
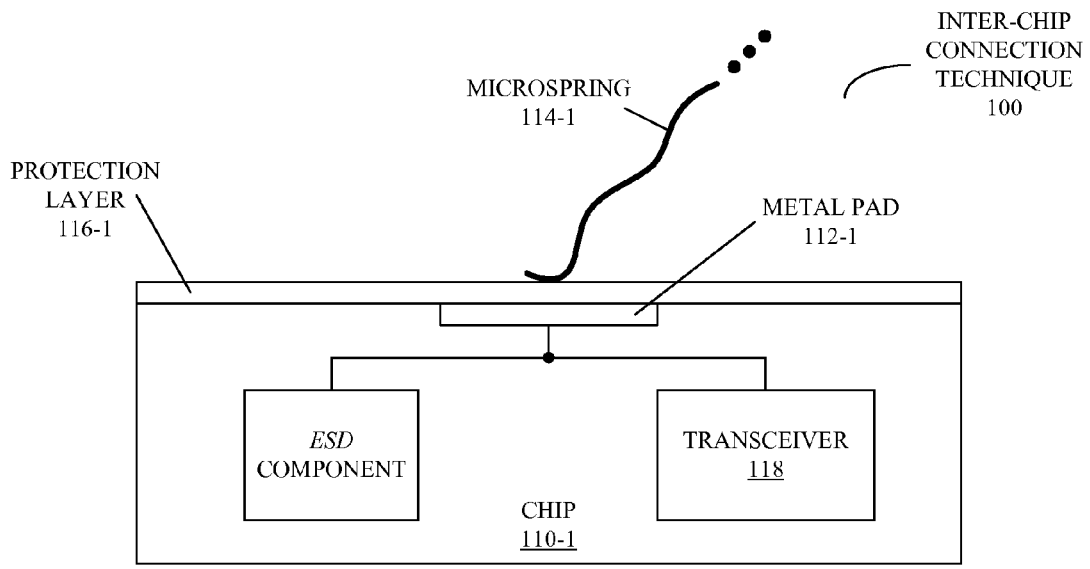
FIG. 1A is a block diagram illustrating an existing inter-chip connection technique with a microspring.

We now describe embodiments of an inter-chip connection technique. FIG. 1A presents a block diagram illustrating an existing inter-chip connection technique 100, in which a microspring 114-1 is used in conjunction with PxC. In this inter-chip connection technique, microspring 114-1 reduces the capacitance between distant signal connectors or pads, such as metal pad 112-1, that communicate using PxC. Note that because PxC transceiver 118 cannot tolerate an arbitrarily valued conductive contact or coupling, the surface of IC or chip 110-1 may be coated with passivation layer 116-1 (such as a glass layer) to prevent microspring 114-1 from conductively contacting metal pad 112-1. Moreover, passivation layer 116-1, microspring 114-1 and metal pad 112-1 may have a rather small capacitance. For example, if the tip of microspring 114-1 has an area (A) of approximately 15×15 $\mu m^2$, and passivation layer 116-1 has a thickness (d) of about 1 µm and a dieletric constant ($\in_r$) of 7.5, then its capacitance to metal pad 112-1 (Cpad) is $$C_{pad} = \frac{\varepsilon_r \cdot \varepsilon_o \cdot A}{d},$$

where $\in_o$ is the permittivity of free space (8.85 pF/m). Using the values in this example, Cpad is 15 fF.

Given this capacitance, we now consider how much power can be transferred by a square-wave power signal through one metal pad. Assuming a 3.3 V power signal oscillating at 500 MHz, and with all energy stored in the capacitor transferred during each cycle (which is a somewhat optimistic assumption), the average power (Poweravg) is Poweravg=Cpad*(Vswing)$^2 \cdot T_{0.5}$, where $T_{0.5}$ is the half period. Using Cpad of 15 fF and $T_{0.5}$ of 1 ns, Poweravg is 0.16 mW.

Furthermore, the magnitude of the series impedance (R) of the contact seen by a high-frequency 5 Gbps data signal is given by $$R = \frac{1}{2 \cdot \pi \cdot f \cdot Cpad},$$

where f is one-half of 5 Gbps or 2.5 GHz. Therefore, R is 4.3 kΩ. While it is possible to transfer an electrical signal with a resistance this large, it would be easier if the impedance were lower. Similarly, while some power can be transmitted through passivation layer 116-1, in order to supply even 1 W of power more than 10,000 microsprings would be needed.

Figure 1B:
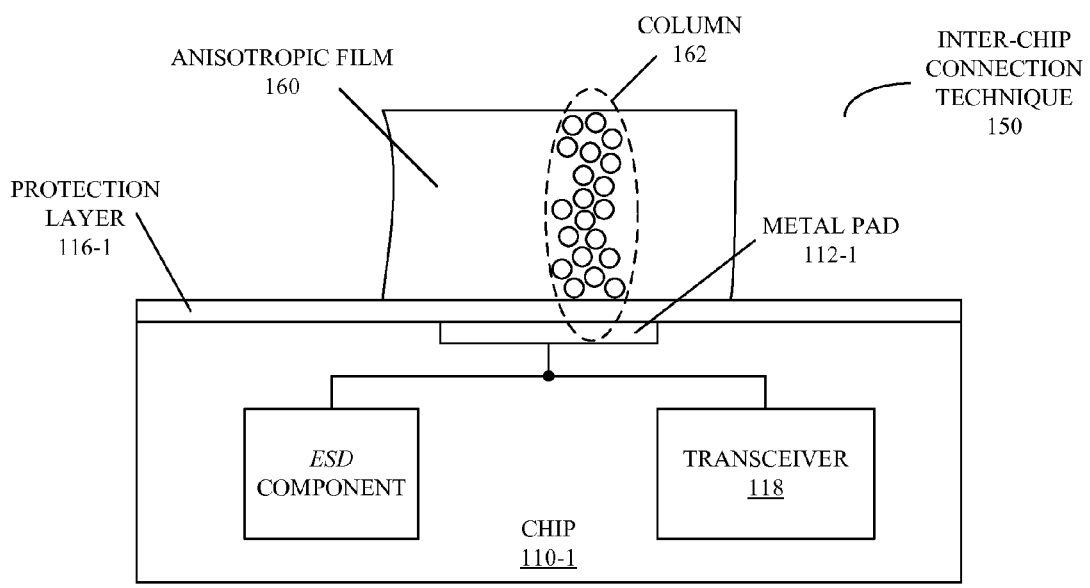
FIG. 1B is a block diagram illustrating an existing inter-chip connection technique with an anisotropic film.

FIG. 1B presents a block diagram illustrating an existing inter-chip connection technique 150, in which an anisotropic-film contact occurs with anisotropic film 160 rather than one or more microsprings. Exemplary anisotropic films include the PariPoser® Material (from Paricon Technologies, Inc., of Fall River, Mass.), as well as a number of patented films, including: U.S. Pat. No. 5,624,268, entitled "Electrical Conductors Using Anisotropic Conductive Films," and U.S. Pat. No. 4,778,950, entitled "Anisotropic Elastomeric Interconnecting System." FIG. 1B illustrates a cross-section of a Pari-Poser-type of anisotropic conductive elastomer film. In anisotropic film 160, small conductive balls are suspended in a silicone rubber such that the balls generally line up into columns (such as column 162) and provide conduction normal, but not tangential, to the surfaces of anisotropic film 160. Similar to FIG. 1A, metal pad 112-1 may have a passivation layer, such as protection layer 116-1, to prevent arbitrary complex conductive contact. As a result, existing inter-chip connection technique 150 may suffer comparable limitations, including limited power or signal energy transfer through the contact.

In the discussion that follows, microsprings and microsprings contacts are used as an illustration of the embodiments in this disclosure. However, it should be understood that these embodiments may also be applied to anisotropic films and anisotropic-film contacts.

Figure 2A:
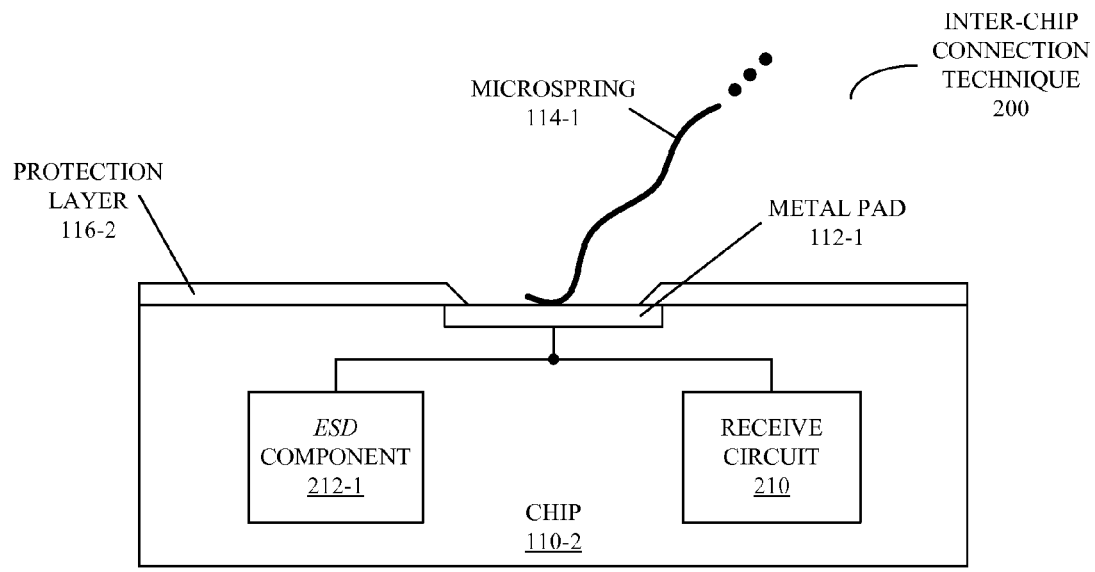
FIG. 2A is a block diagram illustrating an inter-chip connection technique in accordance with an embodiment of the present invention.
Figure 2B:
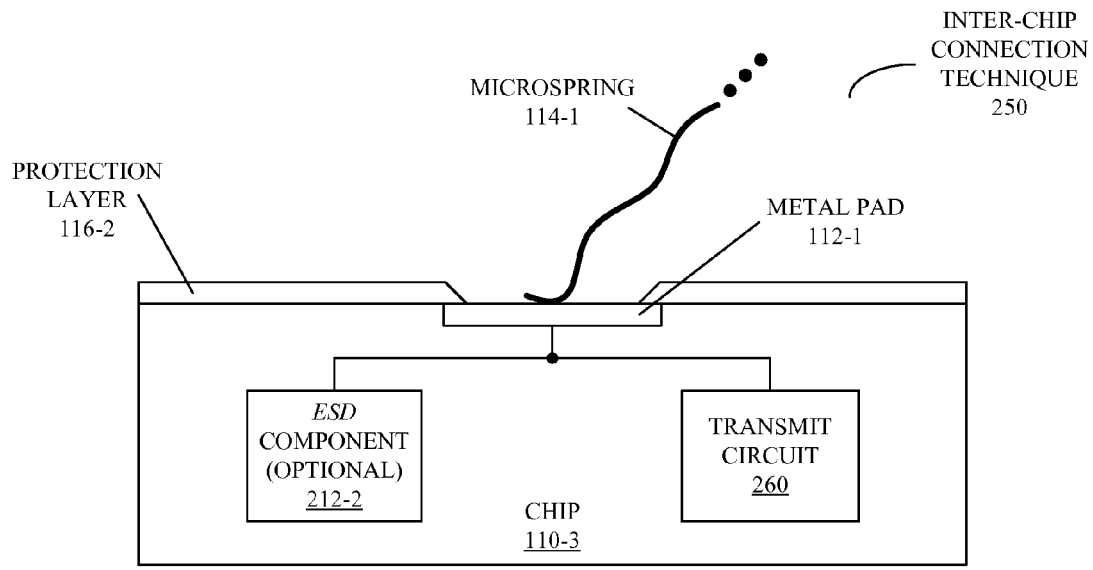
FIG. 2B is a block diagram illustrating an inter-chip connection technique in accordance with an embodiment of the present invention.

FIG. 2A presents a block diagram illustrating an inter-chip connection technique 200 for receive circuit 210, and FIG. 2B presents a block diagram illustrating an inter-chip connection technique 250 for transmit circuit 260. In FIGS. 2A and 2B, one or more microsprings, such as microspring 114-1, contacts metal pad 112-1 on or proximate to surfaces of chips 110, and the associated receive circuit 210 or transmit circuit 260, respectively, to receive or transmit a conductively or capacitively coupled data or power signal. Note that microspring 114-1 couples to metal pad 112-1 where metal pad 112-1 is exposed to air by a cut in passivation layer 116-2 of chips 110. Moreover, chip 110-2 includes ESD component 212-1 (such as a diode to ground) and chip 110-3 may include optional ESD component 212-2 (because transmit circuit 260 may be less sensitive to ESD).

If the thickness (d) of an oxide on the air-exposed metal pad 112-1 is 2 to 3 nm (which, for example, is the self-limited oxide growth on pure aluminum in air), then the average current of the coupled capacitor is increased and the equivalent impedance is decreased by 500-333 times, respectively. Using the values from the preceding calculations, Poweravg is 54 mW and R is 13Ω. Consequently, we can supply 1 W of power using only about 40 microsprings (e.g., 20 to source the supply current, and 20 to sink the supply current). Because tens of thousands of microsprings can be patterned on a chip, hundreds of Watts of power can be supplied.

Note that for power transfer, a large parasitic capacitance associated with ESD components 212 may be acceptable (typically, 2-8 pF for bonded pads). However, for signal transfer, this ESD-component capacitance may unacceptably attenuate high-frequency information or may introduce inter-symbol interference.

Figure 3A:
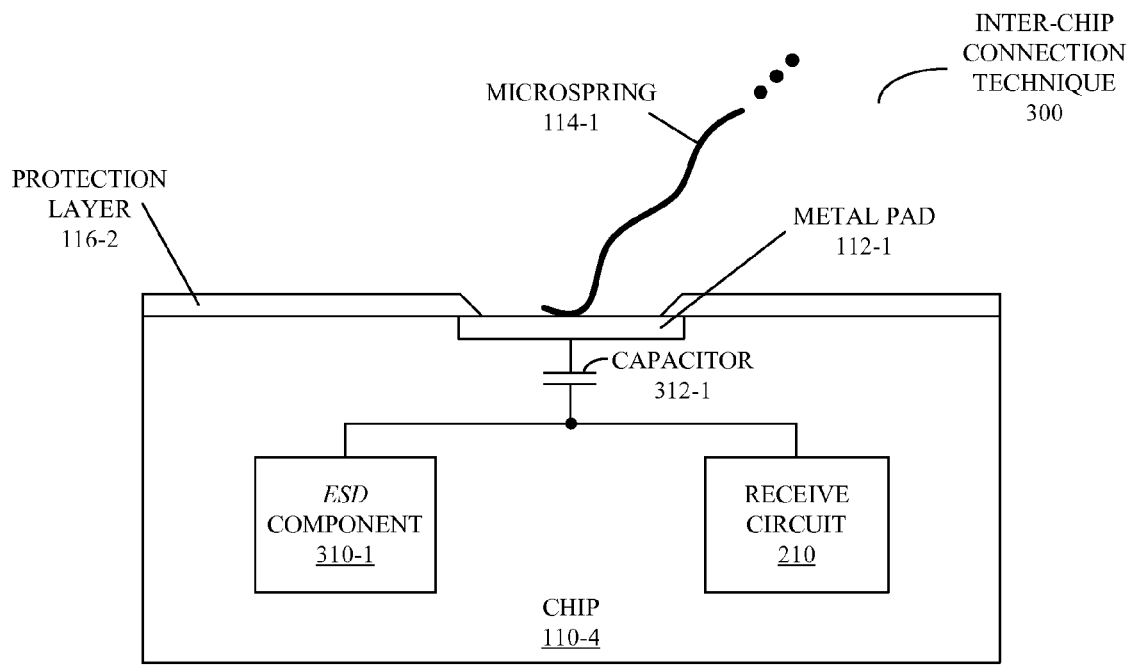
FIG. 3A is a block diagram illustrating an inter-chip connection technique in accordance with an embodiment of the present invention.

FIG. 3A presents a block diagram illustrating an inter-chip connection technique 300 for receive circuit 210. In FIG. 3A, conductively or capacitively coupled metal pad 112-1 is capacitively isolated from receive circuit 210 by capacitor 312-1. More generally, chip 110-4 includes an internal impedance electrically coupled in series between metal pad 112-1 and receive circuit 210, such as an inductor and/or a capacitor. Note that a capacitance of capacitor 312-1 may correspond to a thickness and a dielectric constant of a layer deposited on chip 110-4.

In this embodiment, ESD component 310-1 used to protect the capacitively coupled receive circuit 210 may be significantly reduced. Consequently, ESD component 310-1 may add a much smaller parasitic load, typically as low as 2 fF, because metal pad 112-1 can be protected from an ESD aggressor by nearby air-exposed ESD protector pads (as described further below with reference to FIG. 4).

Inter-chip connection technique 300 also may offer a significant advantage over existing inter-chip connection technique 100 (FIG. 1A). In existing inter-chip connection technique 100 (FIG. 1A), metal pad 112-1 is typically only capacitively coupled to microspring 114-1 by less than half of the parasitic capacitance of metal pad 112-1. This limited capacitance further reduces the electrical signal. In contrast, in FIG. 3A, capacitor 312-1 between metal pad 112-1 and the input to receive circuit 210 can be designed to have a very high ratio of coupling relative to the parasitic capacitance.

Figure 3B:
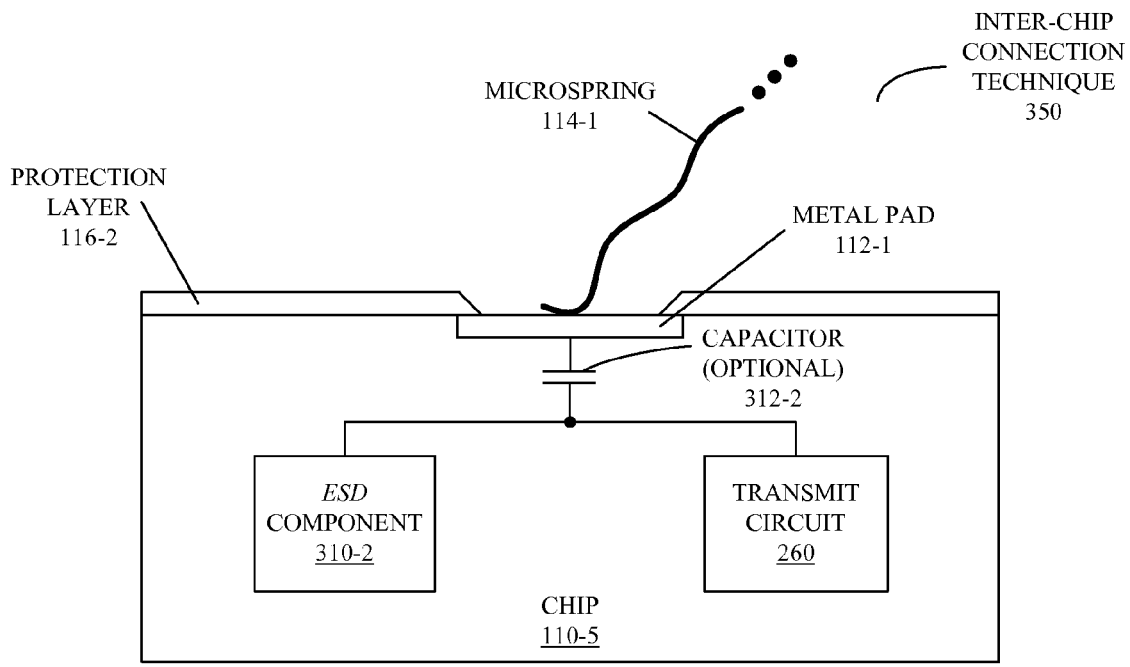
FIG. 3B is a block diagram illustrating an inter-chip connection technique in accordance with an embodiment of the present invention.

Because of the different ESD sensitivity, and the use of capacitive coupling on the chip that includes receive circuit 210 in FIG. 3A, the corresponding chip with the transmit circuit may not need to include a capacitor, such as capacitor 312-1. However, in some embodiments, the corresponding chip with the transmit circuit includes such a capacitor. This is shown in FIG. 3B, which presents a block diagram illustrating an inter-chip connection technique 350 for transmit circuit 260 with optional capacitor 312-2. In some embodiments, chip 110-5 includes optional ESD component 310-2. In the discussion that follows, receive circuits in chips 110 are used as an illustration. In some embodiments, the components and techniques described are used separately or additionally with transmit circuits in chips 110.

Figure 4:
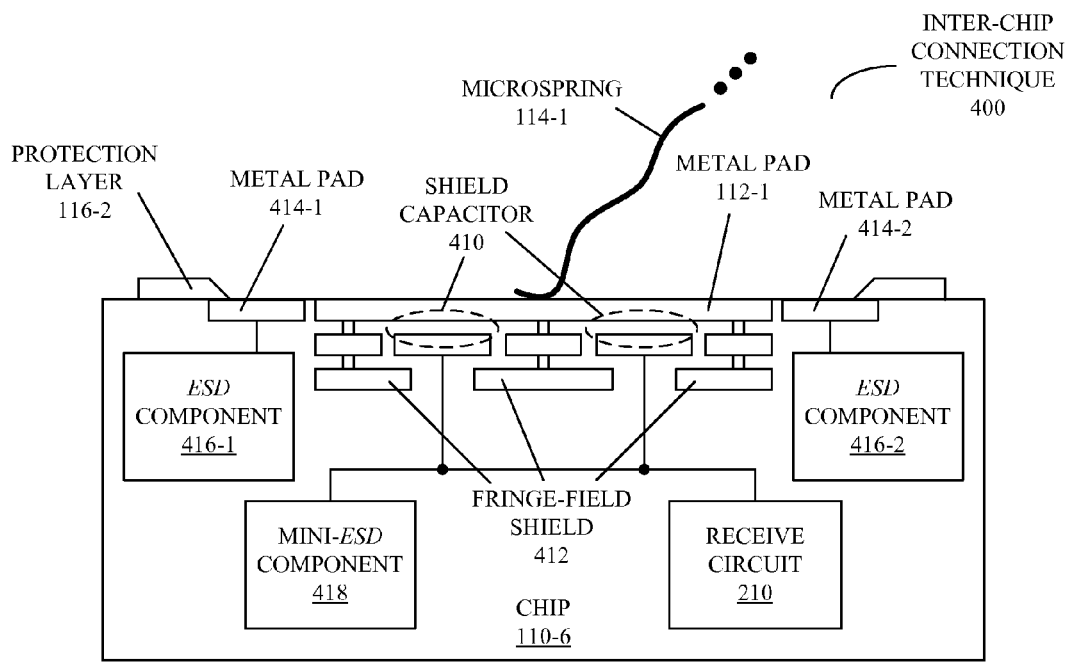
FIG. 4 is a block diagram illustrating an inter-chip connection technique in accordance with an embodiment of the present invention.

FIG. 4 presents a block diagram illustrating an inter-chip connection technique 400 in which interdigitated fingers of metal form a shield capacitor 410 that adds very little parasitic capacitance to the input node of receive circuit 210 in chip 110-6. Hence the received signal can be quite large. Note that the non-conductive shield capacitor 410 connects metal pad 112-1 to receive circuit 210. Moreover, fringe-field shield 412 also reduces parasitic capacitance. The residual parasitic capacitance can be readily driven by the impedance of the contact with microspring 114-1. While FIG. 4 shows interdigitation in one layer of metal, more layers of metal may be used to increase the ratio further.

FIG. 4 also shows ESD air-exposed metal pads 414 on either side of the signal metal pad 112-1. These metal pads, and associated ESD components 416, permit a mini-ESD component 418 (such as a diode or capacitor to ground, which has much smaller parasitic load than ESD components 310) to protect the capacitively shielded receiver input from kV-level ESD events. ESD air-exposed metal pads 414 may be shared among multiple capacitively or conductively coupled microspring metal pads or connections to lower the effective area cost.

Figure 5:
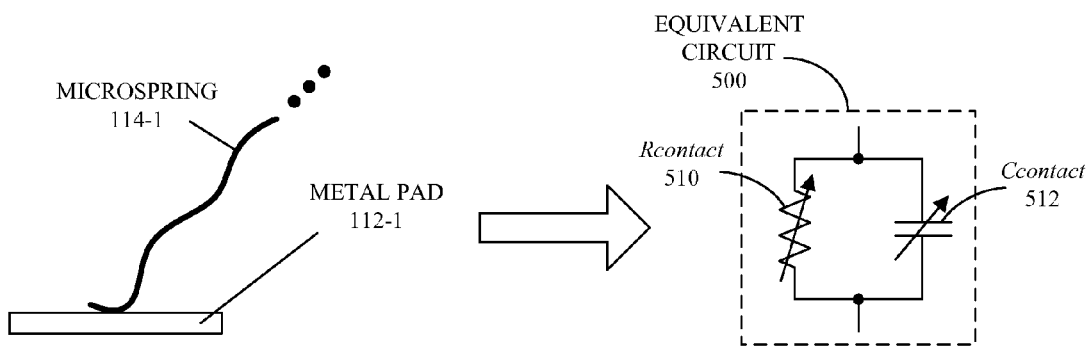
FIG. 5 illustrates an equivalent circuit of a variable complex impedance associated with an inter-chip connection in accordance with an embodiment of the present invention.

FIG. 5 illustrates an equivalent circuit 500 of a variable complex impedance associated with an inter-chip connection, such as a microspring coupled to a connector or a metal pad on a chip. This equivalent circuit has a resistor (Rcontact) 510 in parallel with a capacitor (Ccontact) 512. Rcontact 510 typically has a value between 0.01Ω to infinite impedance, depending on whether and to what degree the microspring tip breaks through the oxide on the metal pad. Ccontact 512 typically has a value on the order of 1-10 pF, depending on the area of overlap between the microspring tip and the metal pad, and the thickness of the oxide and air gap between the microspring tip and the metal pad. In order to maximize the signal or power transferred through a contact, the contact impedance (Zcontact) should be as small as possible. Zcontact is given by $$Zcontact = \frac{Rcontact}{1 + j \cdot w \cdot Ccontact \cdot Rcontact}, \quad (1)$$

where j is the square root of −1 and w is the angular frequency. Based on Eqn. 1, reducing Rcontact 510 ensures that Zcontact is small at all frequencies regardless of Ccontact 512. However, if Rcontact 510 is large or infinite, at high frequencies Ccontact 512 can still result in a small contact impedance. Therefore, in some embodiments, a small contact impedance can be achieved by AC-modulating power and/or data signals regardless of the mix of resistive and capacitive contact.

Figure 6A:
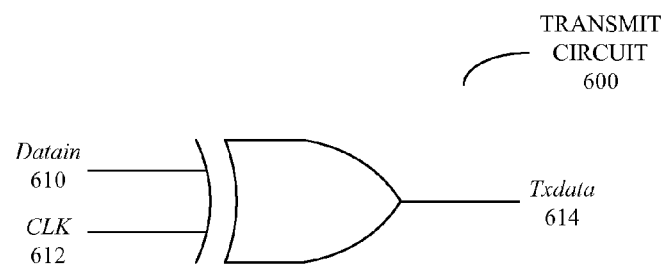
FIG. 6A is a block diagram illustrating a transmit circuit in accordance with an embodiment of the present invention.
Figure 6B:
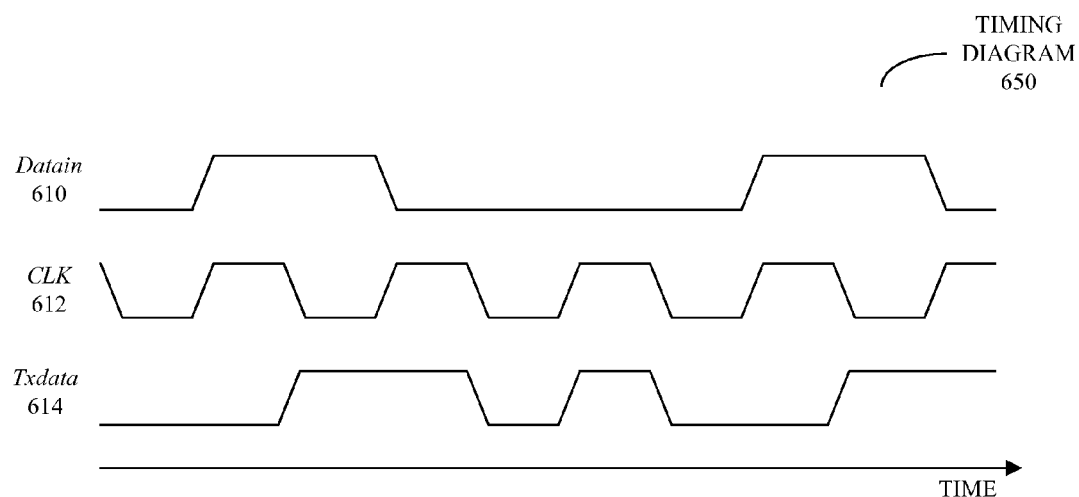
FIG. 6B is a timing diagram illustrating electrical signals in accordance with an embodiment of the present invention.

FIG. 6A presents a block diagram illustrating a transmit circuit 600, and FIG. 6B presents a timing diagram 650 illustrating associated electrical signals. In transmit circuit 600, unencoded signal Datain 610 is modulated by clock signal (Clk) 612 to produce a DC-balanced (50% high and 50% low) signal Txdata 614. This modulation technique is sometimes referred to as 1b2b, which means that one bit of data has been spread across two bits of encoded data. Therefore, this modulation technique has a 50% coding overhead with respect to bandwidth. Other modulation techniques, such as 4b6b or 8b10b or 64b65b, have lower coding overhead but typically require more complex encoding and decoding circuits, as well as higher added latency. In some embodiments, transmit channels are periodically refreshed using spare channels so that Datain 610 does not have to be encoded to be DC balanced. Furthermore, in some embodiments, receive-circuit biasing that is tolerant to inputs with maximum-run-lengths constraints is used rather than DC-balanced signals, such as Txdata 614.

Figure 7:
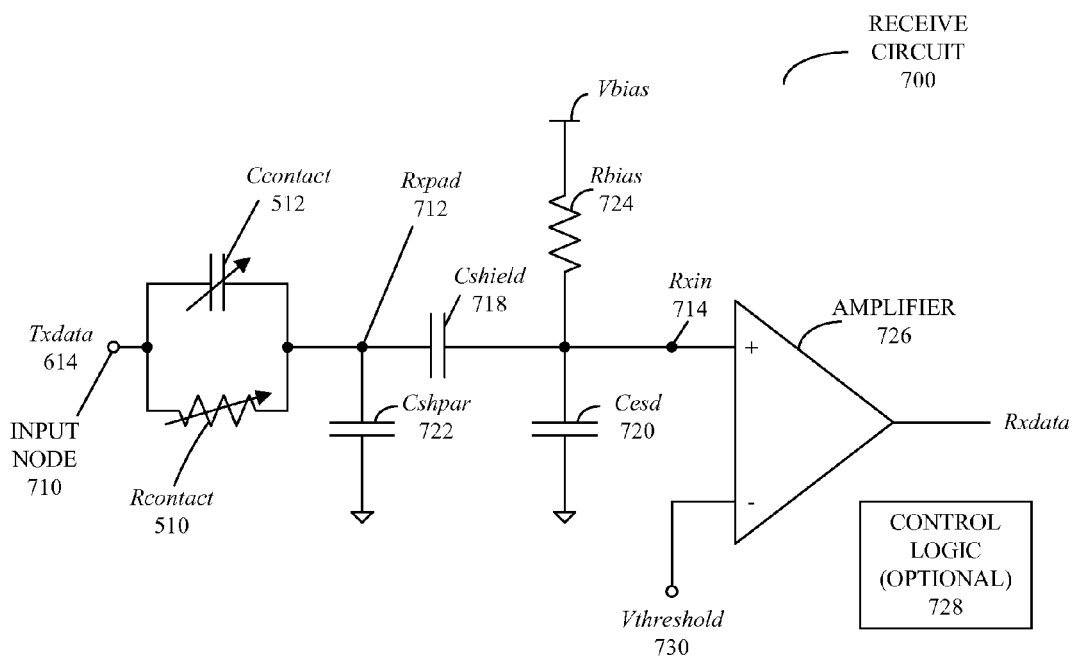
FIG. 7 is a block diagram illustrating a receive circuit in accordance with an embodiment of the present invention.
Figure 8:
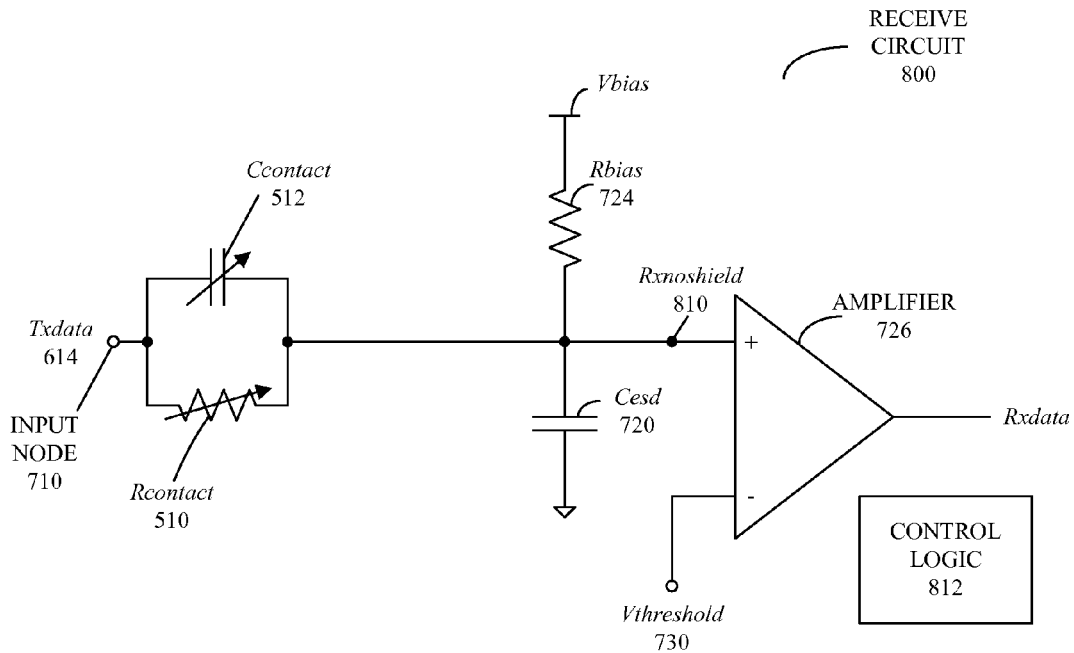
FIG. 8 is a block diagram illustrating a receive circuit in accordance with an embodiment of the present invention.

FIGS. 7 and 8 present block diagrams illustrating receive circuits 700 and 800 which work with Txdata 614. In FIG. 7, the inter-chip connection is shielded by Cshield 718 from ESD component and its parasitic capacitance, which is denoted Cesd 720.

We now discuss the effective impedance between input node 710 and receive input node (Rxin) 714. Because Ccontact 512 typically has values of around 1-10 pF, Cshield 718 may be designed to have a capacitance that is always much less than Ccontact 512, such as 0.1 pF. Given an interdigitated Cshield (as shown in FIG. 4), the capacitance of parasitic capacitor Cshpar 722 may be around half that of Cshield 718 or 0.05 pF. If Rcontact 510 is infinite, and using the y-delta transformation with receive pad node 712 (Rxpad) as the central node connected to input node 710, Rxin 714 and ground (via Cshpar 722), the effective impedance (Zeff) between input node 710 and Rxin 714 is $$Zeff \approx \frac{1}{j \cdot w \cdot Cshield}.$$

If Rcontact 510 is less than infinity, then this approximation becomes even closer to being exact as Zeff is even smaller relative to Cshield 718 and Cshpar 722.

Furthermore, if the AC-modulation is at a frequency that is much larger than the pole-zero pair (high-pass filter) introduced by Rbias 724, Txdata 614 is passed undistorted to Rxin

714, albeit with attenuation from the capacitor divider between Cshield 718 and the sum of Cesd 720 and the input capacitance of amplifier 726. Note that this attenuation may be small because Cesd 720 may be only a few femtoFarads, and the input capacitance of amplifier 726 may be small compared to Cshield 718.

In receive circuit 800, more net signal energy will be coupled to receive input node (Rxnoshield) 810 than to Rxin 714 because there is no Cshield 718 (FIG. 7). Unfortunately, the signal coupled to Rxnoshield 810 may be distorted because it may experience different attenuations and phase shifts at different frequencies. However, this distortion may be reduced or eliminated if the time constant given by the product of Rcontact 510 and Ccontact 512 is matched to the internal time constant of receive circuit 800, i.e., the product of Rbias 724 and the sum of Cesd 720 and the input capacitance of amplifier 726.

Because of the possible variation in Rcontact 510 and/or Ccontact 512 which is associated with the coupling between a microspring and a metal connector or pad, in some embodiments the internal time constant of receive circuit 800 may be adjusted by selecting or adjusting either or both of Rbias 724 and the sum of Cesd 720 and the input capacitance of amplifier 726. This adjustment may be based at least in part on instructions or signals from control logic 812 (or a control-logic circuit). Furthermore, control logic 812 may adjust the internal time constant of receive circuit 800 after directly or indirectly characterizing the variable impedance (e.g., Rcontact 510, Ccontact 512 and/or their product) associated with the inter-chip connection. For example, if the internal time constant of receive circuit 800 is too large, then a square wave on Txdata 614 will be distorted and will undershoot immediately after each transition. Alternatively, if the internal time constant of receive circuit 800 is too small, Txdata 614 will overshoot immediately after each transition. Control logic 812 may sample Rxnoshield 810 twice after each transition, and using the slope of the signal may determine whether to increase or decrease the controllable values of Rbias 724, Cesd 720 and/or the input capacitance of amplifier 726.

Note that while receive circuit 700 (FIG. 7) was described with a fixed configuration (because Cshield 718 in FIG. 7 may have a capacitance that is always much less than Ccontact 512), in some embodiments receive circuit 700 (FIG. 7) includes optional control logic 728 (or a control-logic circuit) which directly or indirectly characterizes the inter-chip connection, and accordingly selects or adjusts the internal time constant of receive circuit 700 (FIG. 7).

Furthermore, while FIGS. 7 and 8 are each illustrated with one signal path, in other embodiments differential signal paths for at least the data signals are used to reduce susceptibility to noise sources. In these embodiments, Vthreshold 730 in FIGS. 7 and 8 is replaced with a second signal path.

Figure 9A:
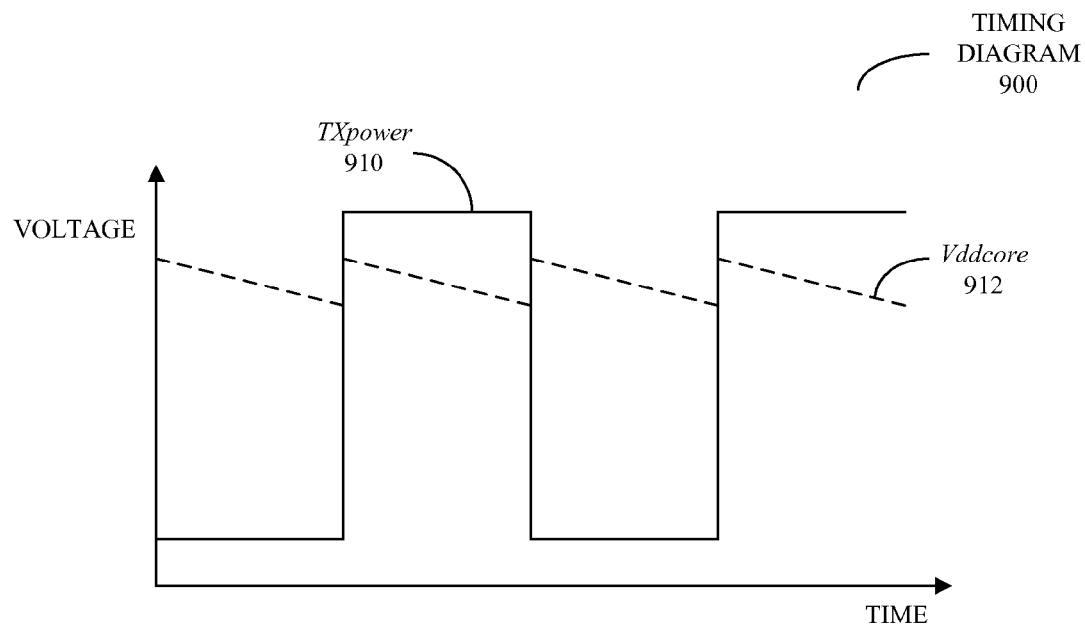
FIG. 9A is a timing diagram illustrating a power signal in accordance with an embodiment of the present invention.
Figure 9B:
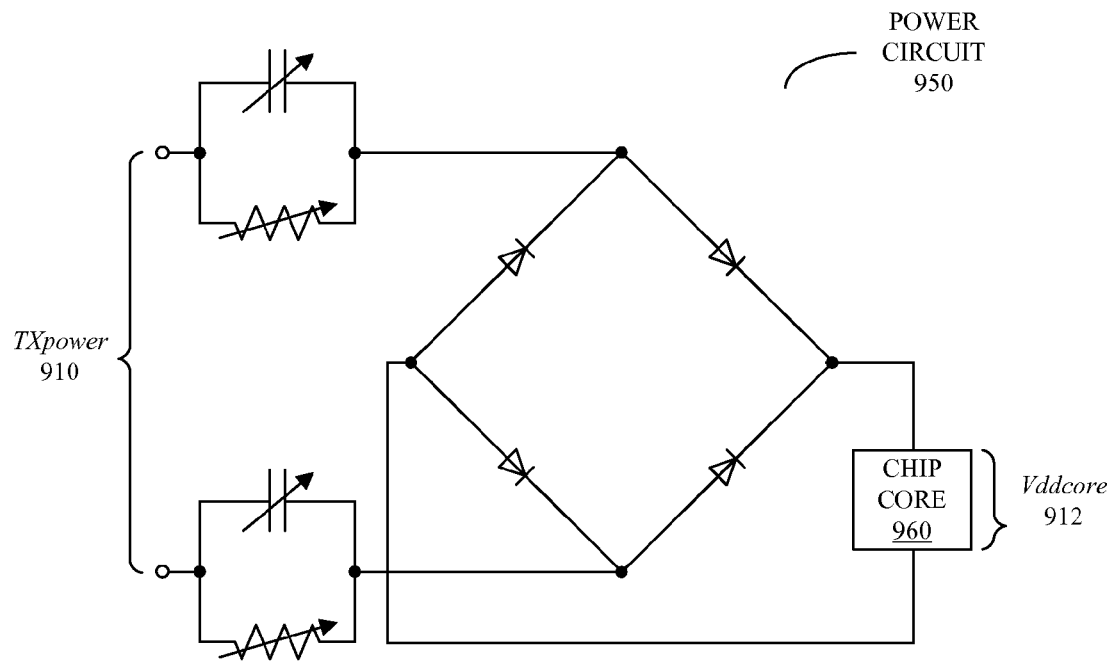
FIG. 9B is a block diagram illustrating a power circuit in accordance with an embodiment of the present invention.

FIG. 9A presents a timing diagram 900 illustrating a power signal TXpower 910, and FIG. 9B presents a block diagram illustrating an associated power circuit 950. Because the inter-chip connection may be capacitive, TXpower 910 may be transmitted as an AC signal. This signal may be directly available from a power supply, or may be generated using DC-to-AC inverter circuits. Note that the signal swing of TXpower 910 may be two diode drops greater than chip core 960 requires in order to compensate for the two diode drops in each arm of power circuit 950. For instance, if chip core 960 requires 1.8 V and each diode drop is 0.15 V (for example for a Schottky diode), then TXpower 910 may be 2.1 V. FIG. 9A also shows net power signal (Vddcore) 912 after power circuit 950. Note that the ripple in Vddcore 912 increases with the current draw of chip core 960 (FIG. 9B), and decreases as more bypass capacitance is added to chip core 960 (FIG. 9B). Additionally, the ripple decreases as the contact impedance, Zcontact, decreases.

While power circuit 950 in FIG. 9B is illustrated as a bridge rectifier, in other embodiments power circuit 950 separately or additionally rectifies TXpower 910 using a switch capacitor rectifier. This approach also permits the rectifier to step the amplitude up or down as required. Moreover, following power circuit 950, there may be a DC-to-DC converter circuit. In order to maximize the power transfer, in some embodiments, neither the transmit chip nor the receive chip in a power-signal channel include a shield capacitor.

Figure 10:
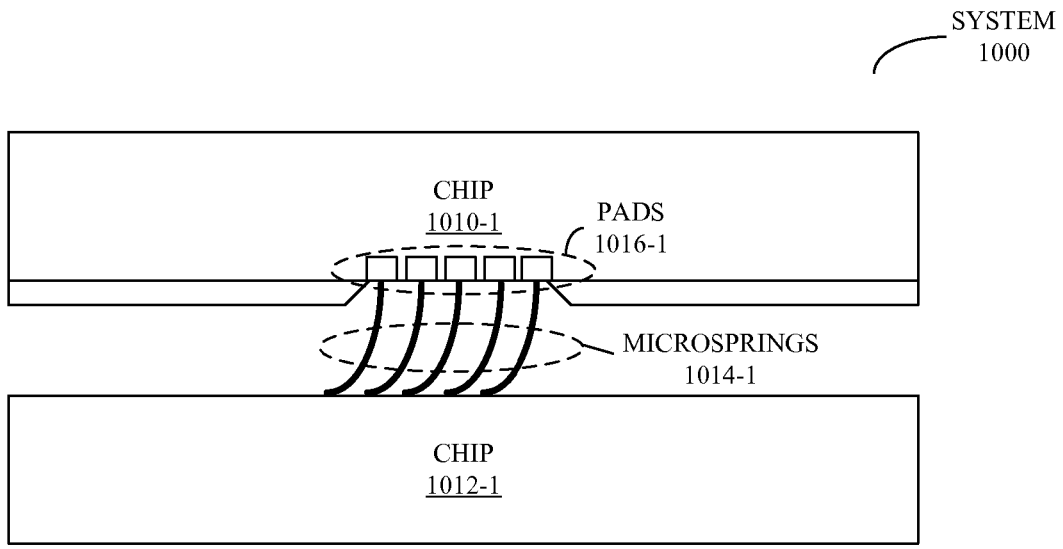
FIG. 10 is a block diagram illustrating a system with chips coupled using microsprings in accordance with an embodiment of the present invention.

We now describe embodiments of systems in which semiconductor dies or chips are coupled to each other (directly or indirectly) using microsprings. FIG. 10 presents a block diagram illustrating a system 1000 with chips 1010-1 and 1012-1 coupled using microsprings 1014-1. Microsprings 1014-1 may be integrated onto chip 1012-1 and contact pads 1016-1 in a glasscut opening may be integrated on chip 1010-1. In variations on this embodiment, there may be separate glasscut openings for different metal pads 1016-1; chips 1010-1 and 1012-1 may contact additional chips using microsprings (as shown below in FIG. 11), or a single chip may possess both microsprings 1014-1 and glasscut openings with pads 1016-1 for contacting one or more other chips.

Figure 11:
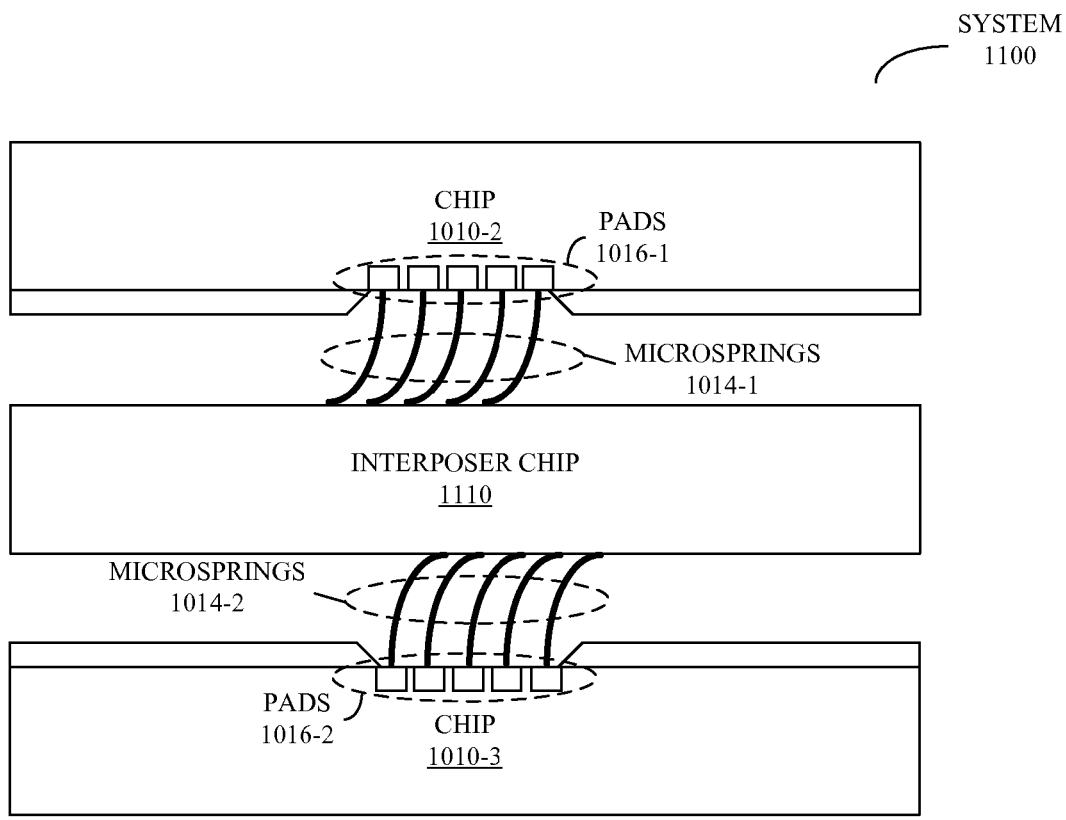
FIG. 11 is a block diagram illustrating a system with chips coupled using microsprings in accordance with an embodiment of the present invention.

FIG. 11 presents a block diagram illustrating a system 1100 with chips 1010-2 and 1010-3 coupled using microsprings 1014-1 and 1014-2. In FIG. 11, the coupling is mediated by an interposer chip 1110 with microsprings 1014-1 and 1014-2 on both faces. Metal pads 1016 on chips 1010-2 and 1010-3 communicate through interposer chip 1110. Note that a given connection between chips 1010-2 and 1010-3 includes two conductive or capacitive contacts in series. By decomposing the corresponding transfer function into two series transfer functions, the analysis described previously still applies.

In FIG. 11, interposer chip 1110 provides all of microsprings 1014-1 and 1014-2 for the contacts to chips 1010-2 and 1010-3. Note the connections from the microsprings 1014-1 on one face of interposer chip 1110 to microsprings 1014-2 on the other face are not shown. These connections may connect the microsprings in the same order from left to right on both faces, may include some reorderings of microspring pairings, or may connect one microspring to multiple other microsprings if desired. In other embodiments, interposer chip 1110 provides the metal-pad portion of the contacts rather than the microspring for at least some set of the connections. Additionally, interposer chip 1110 could extend to the left and right and contact additional chips. Furthermore, the connections between microsprings or metal pads internal to interposer chip 1110 could permit a given chip to communicate with any or all of the chips on both sides of interposer chip 1110.

Figure 12:
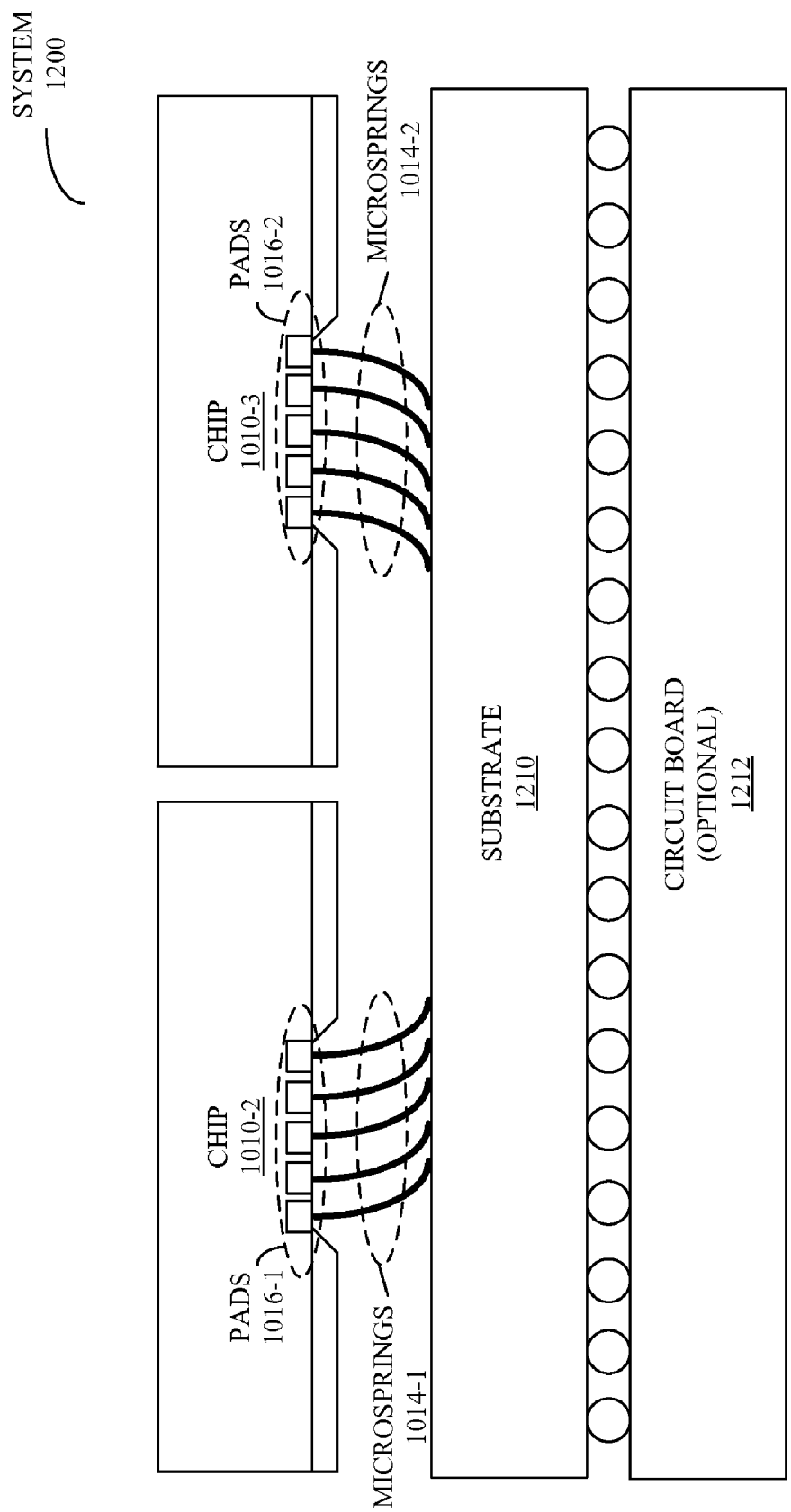
FIG. 12 is a block diagram illustrating a system with chips coupled using microsprings in accordance with an embodiment of the present invention.

FIG. 12 presents a block diagram illustrating a system 1200 with chips 1010-2 and 1010-3 coupled using microsprings 1014-1 and 1014-2 on one side of a common substrate 1210 (such as a ceramic or organic substrate material). This is a variation on system 1100 (FIG. 11) in which all of the chips are on one side of interposer chip 1110 (FIG. 11), which has been renamed substrate 1210. This configuration can be useful in packaging chips because it may be more convenient to bring power and signals into one face of a package, and remove heat from the opposing face. In some embodiments, substrate 1210 is coupled to an optional circuit board 1212 by a ball-grid array (BGA) or a pin-grid array (PGA).

In some embodiments, either the transmit circuit or the receive circuit is on the microspring side or the metal pad side of a connection. As noted previously, the transmit circuit may also couple non-conductively to the inter-chip connection using an on-chip shield capacitor. Although the energy transmitted would be reduced versus a conductive connection to the channel, this approach may reduce the size of one or more ESD components, which are coupled to the transmit circuit, and hence may reduce power consumption.

Because the microsprings in the preceding embodiments no longer require a sharpened tip to scrub-in, these microsprings can have a variety of different shapes, such as: rectangles, circles and/or fingers. These shapes may: make it easier to fabricate the microsprings, increase reliability, and/or increase the contact capacitance. While the non-conductive shield was illustrated using a shield capacitor, in other embodiments one or more inductors, such as coupled spiral metal inductors (which function effectively a transformer), may be used.

Furthermore, in some embodiments there may be two or more microspring geometries on a given chip. For example, data-signal microsprings may be short with blunt ends, while power-signal microsprings may be longer with sharper tips. In this way, the power-signal microsprings may be more likely to scrub-in and form resistive connections, thereby maximizing power transfer, and possibly allowing a simpler DC-power transmission. In addition, by including redundant power-signal microsprings, yield and long-term reliability may be enhanced even if some number of the power-signal microsprings lose conductive connection. Data-signal microsprings may be designed to have a lower insertion force, thereby simplifying the package design, because these connections may use circuits that are tolerant of conductive and/or capacitive contacts (such as receive circuits 700 and 800 in FIGS. 7 and 8).

In some embodiments, electronic alignment techniques are used to correct for planar mechanical misalignments in systems, such as the systems shown in FIGS. 10-12. For example, electronic alignment may be used with conductive-capacitive contacts if a given microsprings contacts an array of transmit or receive micropads or microbars.

Because of surface roughness or non-planarity, the thickness of the oxide and the air gap between a given microspring and metal pad may be greater than the thickness of the oxide layer alone. To increase the capacitance of the contact, in some embodiments a conductive liquid, paste or film may be added to the contact area to fill in any gaps. This would also have the beneficial effect of increasing the area of overlap to the extent that the liquid, paste or film extends beyond the edges of the given microspring.

Note that the preceding embodiments may include fewer components or additional components. For example, in embodiments with anisotropic elastomer films, the expose metal of the chip metal pads may have one or more additional layers added to them so that their top surface extend beyond the elevation of the chip passivation layer. Moreover, two or more components may be combined into a single component and/or a position of one or more components may be changed. In some embodiments, the functionality is implemented more in hardware and less in software, or less in hardware and more in software, as is known in the art. Furthermore, circuits may be implemented using PMOS and/or NMOS, and signals may include digital signals that have approximately discrete values and/or analog signals that have continuous values.

We now describe an embodiment of a process for communicating an electrical signal, which may be performed by a semiconductor die (or one or more circuits on the semiconductor die). FIG. 13 presents a flow chart illustrating a process 1300 for communicating an electrical signal. During operation, the semiconductor die receives the electrical signal from the receive connector that is mechanically and electrically coupled to one or more inter-component connectors (1310). Note that there is a receive variable complex impedance between the receive connector and the one or more inter-component connectors, and this receive variable complex impedance corresponds to the first resistor in parallel with the first capacitor. Then, the semiconductor die characterizes the receive variable complex impedance based at least in part on the received electrical signal (1312). Next, the semiconductor die configures the receive circuit to mitigate signal distortion associated with the receive variable complex impedance based at least in part on the characterization of the receive variable complex impedance (1314).

In some embodiments of process 1300 there may be additional or fewer operations. Moreover, the order of the operations may be changed and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor die, comprising:
   a receive connector, proximate to a surface of the semiconductor die, configured to mechanically and electrically couple to one or more first inter-component connectors, wherein the one or more first inter-component connectors include a microspring or an anisotropic film, thereby defining a receive variable complex impedance between the receive connector and the one or more first inter-component connectors, wherein the receive variable complex impedance corresponds to a first resistor in parallel with a first capacitor; and
   a receive circuit, electrically coupled to the receive connector, to receive an electrical signal, wherein the receive circuit is configured to mitigate signal distortion associated with the receive variable complex impedance.

2. The semiconductor die of claim 1, wherein the receive circuit is configurable to mitigate the signal distortion of the received electrical signal.

3. The semiconductor die of claim 2, wherein a configuration of the receive circuit is selected based at least in part on the receive variable complex impedance.

4. The semiconductor die of claim 3, further comprising a control-logic circuit configured to characterize the receive variable complex impedance and to select the configuration of the receive circuit.

5. The semiconductor die of claim 2, wherein configuring the receive circuit involves adjusting a time constant of an RC circuit in the receive circuit to approximately equal a product of a resistance of the first resistor and a capacitance of the first capacitor.

6. The semiconductor die of claim 1, further comprising an internal impedance electrically coupled in series between the receive connector and the receive circuit, wherein an impedance of the internal impedance dominates the receive variable complex impedance over a range of frequencies associated with the received electrical signal, and wherein the internal impedance includes an inductor or a second capacitor.

7. The semiconductor die of claim 6, wherein a capacitance of the second capacitor is significantly smaller than a capacitance of the first capacitor.

8. The semiconductor die of claim 6, wherein the received electrical signal includes a signal modulated on a carrier having a fundamental frequency greater than zero.

9. The semiconductor die of claim 6, wherein the received electrical signal includes data or power signals.

10. The semiconductor die of claim 9, wherein the receive circuit includes a rectifier circuit to recover a DC-power signal from the received electrical signal.

11. The semiconductor die of claim 6, wherein a capacitance of the second capacitor is defined by a dielectric layer in the semiconductor die.

12. The semiconductor die of claim 6, further comprising one or more electrostatic-discharge-protection connectors proximate and adjacent to the receive connector.

13. The semiconductor die of claim 12, further comprising an electrostatic-discharge-protection component electrically coupled to the receive connector in parallel with the receive circuit.

14. The semiconductor die of claim 6, further comprising a fringe-field shield proximate and adjacent to the second capacitor.

15. The semiconductor die of claim 1, wherein the received electrical signals include data or power for the semiconductor die.

16. The semiconductor die of claim 1, wherein the receive connector is on the surface of the semiconductor die.

17. The semiconductor die of claim 1, further comprising:
a transmit connector proximate to the surface of the semiconductor die, configured to mechanically and electrically couple to one or more second inter-component connectors, thereby defining a transmit variable complex impedance between the transmit connector and the one or more second inter-component connectors, wherein the transmit variable complex impedance corresponds to a second resistor in parallel with a second capacitor; and
a transmit circuit, electrically coupled to the transmit connector, to transmit another electrical signal.

18. A system, comprising:
a first semiconductor die;
an inter-connect component, mechanically and electrically coupled to the first semiconductor die, wherein the inter-connect component includes multiple inter-component connectors;
a second semiconductor die, mechanically and electrically coupled to the inter-connect component, wherein the second semiconductor die includes:
a receive connector, on a surface of the semiconductor die, configured to mechanically and electrically couple to one or more of the inter-component connectors, thereby defining a receive variable complex impedance between the receive connector and the one or more of the inter-component connectors, wherein the receive variable complex impedance corresponds to a first resistor in parallel with a first capacitor; and
a receive circuit, electrically coupled to the receive connector, to receive an electrical signal, wherein the receive circuit is configured to mitigate signal distortion associated with the receive variable complex impedance.

19. A method for communicating an electrical signal, comprising:
receiving, on a semiconductor die, the electrical signal from a receive connector mechanically and electrically coupled to one or more inter-component connectors, wherein the one or more inter-component connectors include a microspring or an anisotropic film, and wherein there is a receive variable complex impedance between the receive connector and the one or more inter-component connectors, and wherein the receive variable complex impedance corresponds to a first resistor in parallel with a first capacitor;
characterizing the receive variable complex impedance based at least in part on the received electrical signal; and
configuring a receive circuit to mitigate signal distortion associated with the receive variable complex impedance based at least in part on the characterization of the receive variable complex impedance.

* * * * *